United States Patent
Inoue

(10) Patent No.: US 7,808,762 B2
(45) Date of Patent: Oct. 5, 2010

(54) SEMICONDUCTOR DEVICE PERFORMING OVERHEAT PROTECTION EFFICIENTLY

(75) Inventor: Kohsuke Inoue, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 113 days.

(21) Appl. No.: 12/071,037

(22) Filed: Feb. 14, 2008

(65) Prior Publication Data

US 2008/0192391 A1    Aug. 14, 2008

(30) Foreign Application Priority Data

Feb. 14, 2007    (JP) .............................. 2007-033047

(51) Int. Cl.
   *H02H 5/04*    (2006.01)
(52) U.S. Cl. ...................................... 361/103; 361/93.8
(58) Field of Classification Search ................. 361/103, 361/104, 106, 93.8
   See application file for complete search history.

(56) References Cited

U.S. PATENT DOCUMENTS

| | | | | |
|---|---|---|---|---|
| 5,119,265 A | * | 6/1992 | Qualich et al. | ............... 361/103 |
| 2005/0264971 A1 | * | 12/2005 | Morino | ....................... 361/103 |

FOREIGN PATENT DOCUMENTS

JP    2005-100295    4/2005

* cited by examiner

*Primary Examiner*—Danny Nguyen
(74) *Attorney, Agent, or Firm*—Dickstein Shapiro LLP

(57) ABSTRACT

A semiconductor device includes a constant voltage circuit configured to convert an input voltage to a predetermined voltage by controlling an output transistor, and an overheat protection circuit configured to restrict output current of the constant voltage circuit according to temperature of the semiconductor device. The overheat protection circuit includes a diode to detect the temperature of the semiconductor device and a resistor connected in series with the diode.

6 Claims, 4 Drawing Sheets

_US 7,808,762 B2_

SEMICONDUCTOR DEVICE PERFORMING OVERHEAT PROTECTION EFFICIENTLY

CROSS-REFERENCE TO RELATED APPLICATION

This patent specification is based on and claims priority from Japanese Patent Application No. 2007-033047 filed on Feb. 14, 2007 in the Japan Patent Office, the entire contents of which are hereby incorporated by reference herein.

BACKGROUND

1. Field of the Invention

The present invention relates to a semiconductor device, and more specifically, to a semiconductor device performing overheat protection efficiently.

2. Description of the Related Art

Recently, a variety of different types of high performance-electrical equipment, such as computer systems and mobile phones, have developed rapidly and come to be used widely. Such electrical equipment requires a high performance power circuit, and such a power circuit is generally integrated into a semiconductor device. The power circuit includes a constant-voltage-generation circuit to achieve a stable operation.

Such a semiconductor device having a constant-voltage-generation circuit commonly employs a protection circuit to avoid destruction due to a latch-up phenomenon triggered by an accidental surge pulse. An over-current protection circuit is generally used as the protection circuit for the constant-voltage-generation circuit. However, if a voltage difference between input and output voltages is large, a temperature of the semiconductor chip increases rapidly especially around an output transistor and may exceed a maximum rating before the over-current protection circuit is effective.

A variety of power protection methods are used to avoid such an overheat condition. In one example of such power protection methods, a product of an input voltage and an output current is checked and used to protect the semiconductor device. In this power protection method, however, it is necessary to detect both voltage and current. Accordingly, a complicated multiplication circuit is required. As a result, the size of the semiconductor device increases due to employment of the complicated multiplication circuit.

Because of the drawback described above, an overheat protection circuit that protects the semiconductor device based on the temperature of the semiconductor device may be used instead of using the power protection method. Such an overheat protection circuit generally employs a thermal-shut-down circuit.

FIG. 1 illustrates a background thermal-shut-down circuit 10. The thermal-shut-down circuit 10 includes an output terminal 101, a constant current source 102, a diode 103, a comparator 104, an operational amplifier 105, an NMOS (N-type Metal Oxide Semiconductor) transistor 106, resistors 107 through 109, a reference voltage generator 110, and a capacitor 114. In the thermal-shut-down circuit 10, a bias current is supplied to the diode 103 from the constant current source 102. The diode 103 detects the temperature of the semiconductor chip under the bias current. The comparator 104 compares a voltage VF at an anode of the diode 103 with a reference voltage Vr generated by the operational amplifier 105, the reference voltage generator 110, the resistors 107 through 109, and the capacitor 114. When the temperature of the semiconductor device increases and an anode voltage of the diode 103 VF drops below the reference voltage Vr, an output signal of the comparator 104 is inverted so as to output an overheat protection signal to the output terminal 101.

FIG. 2 illustrates a constant voltage circuit 1 that includes the thermal-shut-down circuit 10 of FIG. 1.

In FIG. 2, the reference voltage Vr in FIG. 1 is indicated by Vr2. Similarly, the constant current source 102, the diode 103 VF, and the comparator 104 are indicated by I1, D1, and 11a respectively. An output of the thermal-shut-down circuit 10 is wired to a gate of an output transistor M1. When the temperature of the semiconductor chip increases and the anode voltage VF of the diode D1 decreases below the reference voltage Vr2, an output voltage of the comparator 11a becomes high, making a gate voltage of the output transistor M1 high to shut off the output transistor M1. As a result, the semiconductor chip can be prevented from overheating.

In FIG. 2, the highest temperature portion in the semiconductor chip is located around the output transistor M1. Therefore, the diode D1 that is the temperature detector may be disposed as close to the output transistor M1 as possible.

FIG. 3 illustrates a cross-sectional schematic view of a semiconductor device that includes the output transistor M1 and the diode D1. In FIG. 3, the output transistor M1 is provided on the left side and the diode D1 is provided on the right side, respectively. A P-type substrate (Psub) 21 is employed in this semiconductor device. As for the output transistor M1, an N– region 18 is formed on the P-type substrate 21. Further, two P+ regions 11 and 12 are formed in the N– region 18. The P+ region 11 is a drain electrode D of the output transistor M1 and the P+ region 12 is a source electrode S. A gate electrode is formed between the P+ regions 11 and 12.

An N+ region 13 is formed in the N– region 18 and is connected to power supply Vdd. The source electrode S of the output transistor M1 is connected to power supply Vdd and the drain electrode D is connected to the output terminal Vout of the constant voltage circuit 1 by wiring provided on the semiconductor chip.

The diode D1 is formed by a short circuit of a base and a collector of an NPN transistor. The NPN transistor is formed in an Nwell 20 formed in the P-type substrate 21. An N+ region 15 and a P– region 19 are formed in the Nwell 20. Further, a P+ region 16 and an N+ region 17 are formed in the P– region 19. The N+ region 15 is a collector of the NPN transistor. Similarly, P+ region 16 is a base of the NPN transistor, and the N+ region 17 is an emitter of the NPN transistor, respectively. The N+ region 15 that is the collector of the NPN transistor, and the P+ region 16 that is the base of the NPN transistor are connected to form the diode D1. A connection node of the N+ regions 15 and the P+ region 16 is an anode A of the diode D1. The N+ region 17 that is the emitter of the NPN transistor is a cathode K of the diode D1. The cathode K of the diode D1 is connected to a P+ region 14 formed in the P-type substrate 21 by wiring. The P+ region 14 is connected to ground Vss.

When devices are formed on the P-type substrate 21, it is known that some parasitic elements are formed unintentionally on the semiconductor device. In FIG. 3, for example, PNP transistors Q1 and Q2, and a NPN transistor Q3 are formed unintentionally. The PNP transistor Q1 includes an emitter that is the P+ region 11, a base that is the N– region 18, and a collector that is the P-type substrate 21. The PNP transistor Q2 includes an emitter that is the P+ region 12, a base that is the N– region 18, and a collector that is the P-type substrate 21. The NPN transistor Q3 includes a collector that is the N– region 18, and a base that is the P-type substrate 21, and an emitter that is the Nwell region 20.

FIG. 4 illustrates a circuit diagram showing these three parasitic transistors Q1, Q2 and Q3, the diode D1, and the constant current source I1. In FIG. 4, an area surrounded by a dotted line represents a circuit block comprising parasitic transistors. Resistors R11 and R12 are resistances at each region. As shown in FIG. 4, the emitter of the PNP transistor Q1 is connected to the output terminal Vout, the collector is connected to the collector of the PNP transistor Q2 and to the base of the NPN transistor Q3. Further, the base of the PNP transistor Q1 is commonly connected to the base of the PNP transistor Q2.

The source of the PNP transistor Q2 is connected to the power supply terminal Vdd. The resistor R11 is connected between the source and the base of the PNP transistor Q2. The base of the PNP transistor Q2 is connected to the collector of the NPN transistor Q3. The emitter of the NPN transistor Q3 is connected to the anode A of the diode D1 and the base of the NPN transistor Q3 is connected to ground through the resistor R12.

When a high surge voltage is applied to the output terminal Vout, a voltage at the emitter of the PNP transistor Q1 rises. When the voltage at the emitter of the PNP transistor Q1 exceeds 0.7 v above a voltage at the power supply terminal Vdd, a base current flows at the PNP transistor Q1. Consequently, the PNP transistor Q1 turns on. Since a surge current flows through the resistor R12, the NPN transistor Q3 turns on due to a voltage drop at the resistor R12. Further, the PNP transistor Q2 turns on due to a voltage drop generated at the resistor R11.

Once the PNP transistor Q2 is on, the voltage drop at the resistor R12 is kept due to a collector current of the PNP transistor Q2 even after the surge voltage is stopped. Consequently, the NPN transistor Q3 is kept on. As a result, current keeps flowing from the power supply terminal Vdd to ground Vss through two paths, i.e., a path through the PNP transistor Q2 and the resistor R12, and a path through the resistor R11 and the NPN transistor Q3. This phenomenon is known as "latch-up phenomenon" (or simply "latch-up")

When the diode D1 is placed closer to the output transistor M1 for detecting the temperature of the output transistor M1 quickly and accurately, a latch-up current increases because the collector current of the PNP transistor Q2 and NPN transistor Q3 increase. Accordingly, wiring formed on the semiconductor chip may be melted and the circuit destroyed.

SUMMARY

This patent specification describes a novel semiconductor device that includes a constant voltage circuit configured to convert an input voltage to a predetermined voltage by controlling an output transistor, and an overheat protection circuit configured to restrict output current of the constant voltage circuit according to temperature of the semiconductor device, and includes a diode to detect temperature of the semiconductor device, and a resistor connected in series with the diode.

This patent specification further describes a novel semiconductor device that includes a diode to detect the temperature of the semiconductor device. The diode is provided at a position close to an output transistor.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF EXEMPLARY EMBODIMENTS

Figure 1:
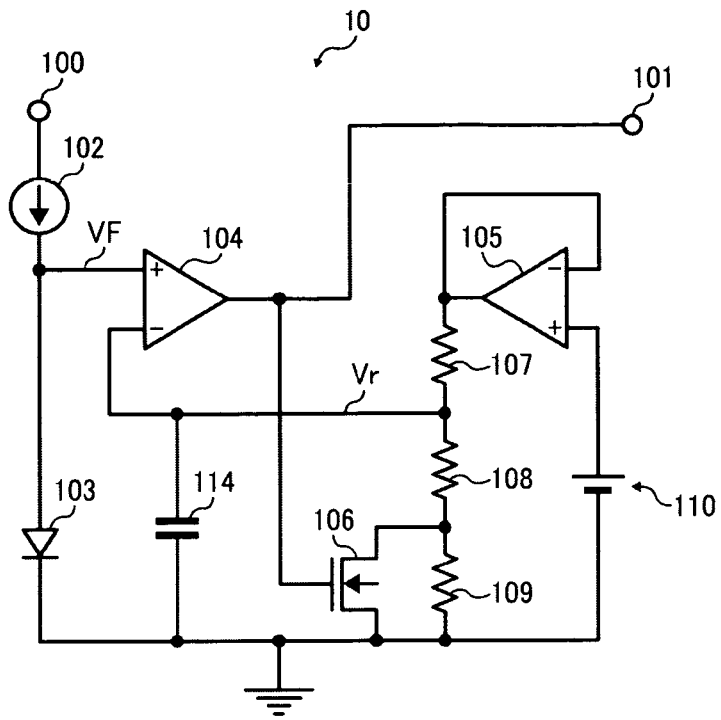
FIG. 1 illustrates a background thermal-shut-down circuit.

In describing exemplary embodiments illustrated in the drawings, specific terminology is employed for the sake of clarity. However, the disclosure of this patent specification is not intended to be limited to the specific terminology so selected, and it is to be understood that each specific element includes all technical equivalents that operate in a similar manner and achieve a similar result.

Figure 5:
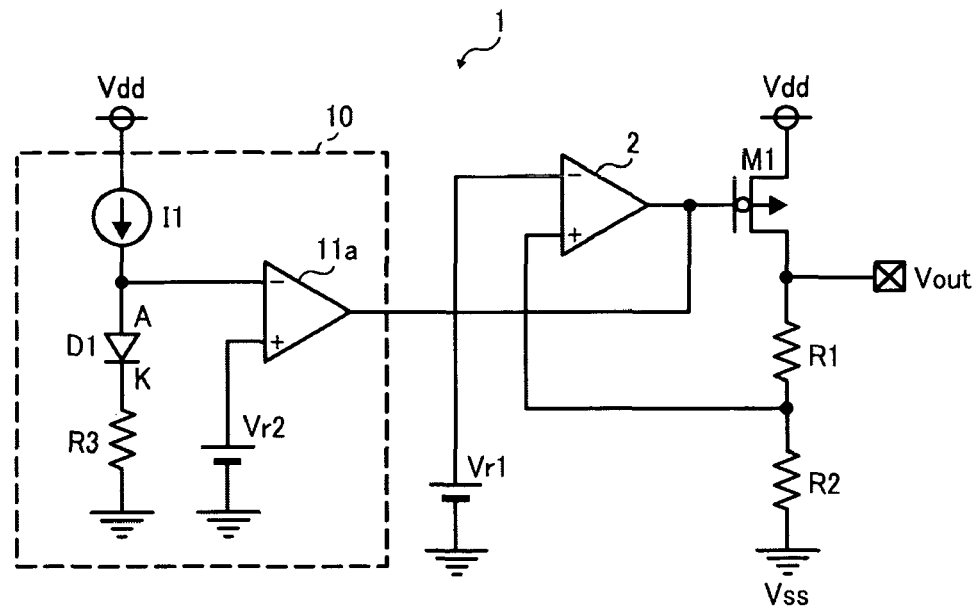
FIG. 5 illustrates a circuit diagram of a constant voltage circuit having an overheat-protection circuit according to an example embodiment.

Referring now to the drawings, wherein like reference numerals designate identical or corresponding parts throughout the several views thereof, and in the first instance to FIG. 5, a constant voltage circuit according to exemplary embodiments of the present invention is described.

Figure 2:
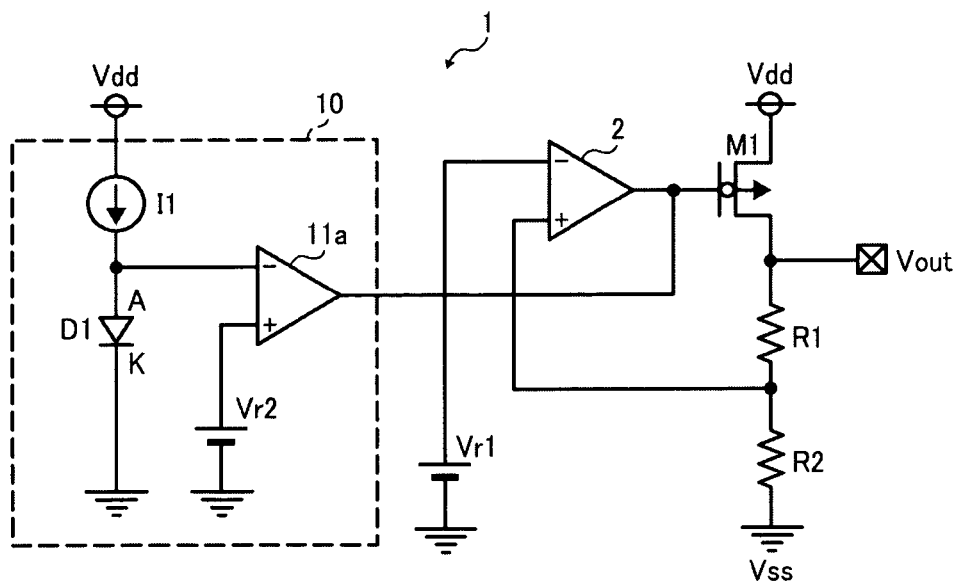
FIG. 2 illustrates a background constant voltage circuit that includes the thermal-shut-down circuit of FIG. 1.

FIG. 5 illustrates a circuit diagram of a constant voltage circuit having an overheat-protection circuit according to an example embodiment. A resistor R3 is provided between a diode D1 for detecting temperature and a ground Vss, which is different from the background circuit shown in FIG. 2. A constant current source I1 supplies current to the diode D1 and the resistor R3. A comparator 11a compares a potential at an anode A of the diode D1 with a reference voltage Vr2.

Under normal conditions, a potential at the anode A of the diode D1 is higher than the reference voltage Vr2. However, when temperature of the semiconductor chip rises and reaches a predetermined value, the potential at the anode A of the diode D1 becomes lower than the reference voltage Vr2. An output signal of the comparator 11a is inverted so as to output a signal with high level. Since an output terminal of the comparator 11a is connected to the gate of the output transistor M1, the gate voltage is then raised to turn the output transistor M1 off. Accordingly, an output current is shut off.

Figure 3:
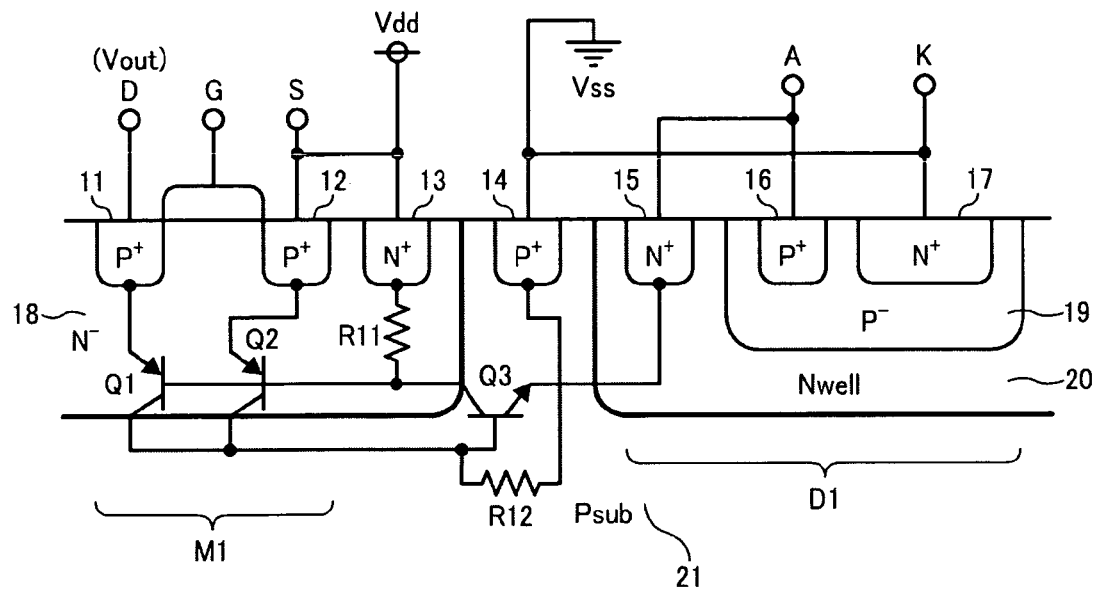
FIG. 3 illustrates a cross-sectional schematic of a semiconductor device which includes an output transistor and a temperature detection diode.
Figure 6:
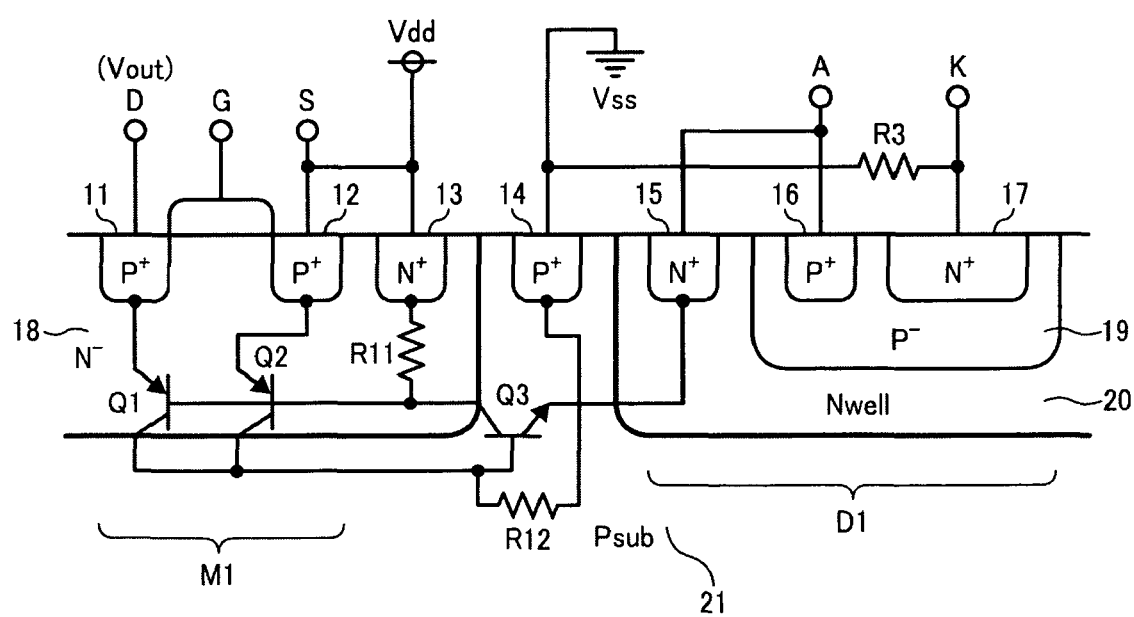
FIG. 6 illustrates a cross-sectional schematic of a semiconductor chip that includes the diode and the output transistor.

FIG. 6 illustrates a cross-sectional schematic view of a semiconductor chip that includes the diode D1 and the output transistor M1. In the example embodiment, a resistor R3 is formed on the semiconductor chip between an N+ region that is a cathode electrode of the diode D1 and the P+ region 14 that is connected to ground, differently from the cross-sectional view of the background circuit shown in FIG. 3. Parasitic transistors Q1, Q2 and Q3 are formed similarly to FIG. 3.

Figure 4:
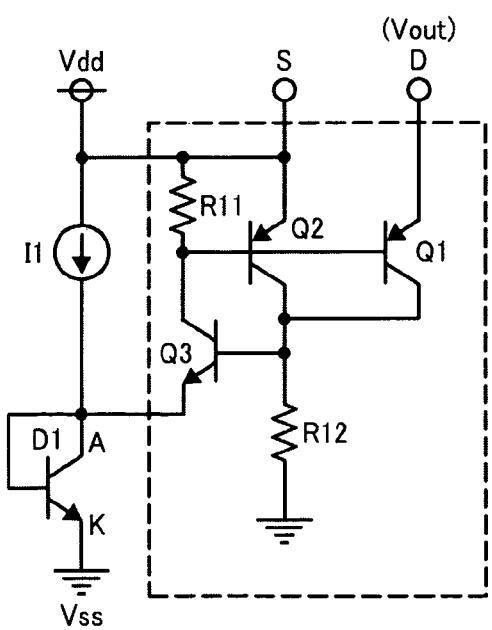
FIG. 4 illustrates a circuit diagram showing parasitic transistors, the diode, and the constant current source.
Figure 7:
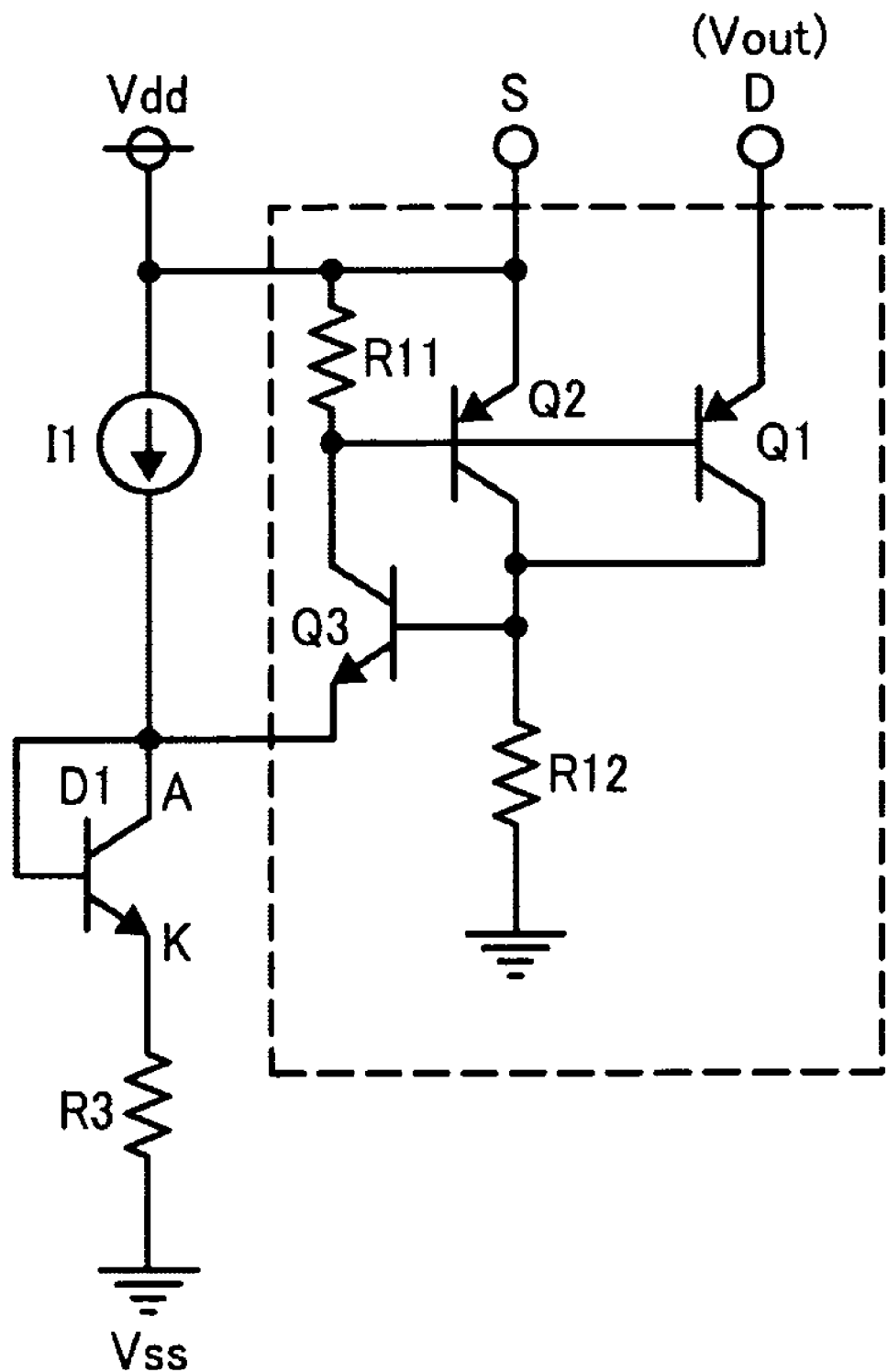
FIG. 7 illustrates a circuit diagram showing wiring for the parasitic transistors, the diode, the resistor, and the constant current source.

FIG. 7 illustrates a circuit diagram showing wiring for parasitic transistors Q1, Q2 and Q3, the diode D1, the resistor R3, and the constant current source I1. Resistors R11 and R12 are formed in each region. In FIG. 7, the resistor R3 is connected between the cathode K of the diode D1 and ground Vss, which is different from the background circuit shown in FIG. 4.

Referring to FIG. 7, operation of the circuit of the example embodiment is now described.

When a high surge voltage is applied to the output terminal Vout, a base current flows at the PNP transistor Q1 and the PNP transistor Q1 turns on. As a result, a collector current of the PNP transistor Q1 flows through the resistor R12. If a voltage drop at the resistor R12 is large enough to turn the NPN transistor Q3 on, a collector current of the NPN transistor Q3 flows through the resistor R11, and an emitter current flows through the diode D1 and the resistor R3.

When the emitter current of the NPN transistor Q3 increases, the voltage drop at the resistor R3 increases so as to raise the emitter voltage of the NPN transistor Q3. As a result, a voltage difference between the base and the emitter of the NPN transistor Q3 decreases, and the base current of the NPN transistor Q3 decreases. Thus, a negative feedback takes place. Consequently, the collector current of the NPN transistor Q3 becomes much smaller than the collector current of corresponding NPN transistor in the background circuit shown in FIG. 4, even while the high surge voltage is applied to the output terminal Vout.

When the collector current of the NPN transistor Q3 is small, the voltage drop at the resistor R11 is also small and the PNP transistor Q2 does not turn on. Further, when the high surge voltage is removed, the base current of the NPN transistor Q3 stops flowing and the NPN transistor Q3 is cut off. Consequently, a latch-up phenomenon does not occur. Further, since the collector current of the NPN transistor Q3 is small, the wiring formed on the semiconductor is not melted and the circuit cannot be destroyed.

Thus, as described above, it is possible to avoid the latch-up phenomenon by introducing the resistor R3 only with a serial connection to the diode D1. Further, it is also possible to reduce a penetration current from power supply terminal Vdd to ground Vss so that the wirings formed on the semiconductor can be prevented from melting.

The resistor R3 may be formed of metal, or may be formed of a diffusion resistor. The resistance of the resistor R3 has a value with which the latch-up phenomenon is prevented without fail, and a temperature detection range determined by the diode D1 is not affected.

In this example embodiment, an NPN transistor is used as the diode D1 that is the temperature detector. However, any device having a PN connection structure can be employed.

Numerous additional modifications and variations are possible in light of the above teachings. It is therefore to be understood, that within the scope of the appended claims, the disclosure of this patent specification may be practiced otherwise than as specifically described herein.

What is claimed is:

1. A semiconductor device comprising:
    a constant voltage circuit configured to convert an input voltage to a predetermined voltage by controlling an output transistor; and
    an overheat protection circuit configured to restrict output current of the constant voltage circuit in accordance with temperature of the semiconductor device,
    the overheat protection circuit including:
    a diode to detect the temperature of the semiconductor device;
    a resistor connected in series with the diode;
    a reference voltage line; and
    a comparator for comparing a potential at an anode of the diode to a potential on the reference voltage line, and if the potential at the anode is greater than the potential on the reference voltage line then controlling the output transistor to stay on, and if the potential at the anode is less than the potential on the reference voltage line then controlling the output transistor to turn off, wherein the comparator outputs a signal at a low level when the potential at the anode is greater than the potential on the reference voltage line and the comparator outputs a signal at a high level when the potential at the anode is less than the potential on the reference voltage line, and wherein the resistor is formed on the semiconductor device between an N+ region that is a cathode electrode of the diode and a P+ region that is connected to ground.

2. The semiconductor device according to claim 1, wherein the diode is positioned close to the output transistor.

3. The semiconductor device of claim 1, wherein the comparator outputs a signal at a high level shutting off an output current when the potential at the anode is less than the potential on the reference voltage line.

4. A semiconductor device comprising:
    a constant voltage circuit configured to convert an input voltage to a predetermined voltage by controlling an output transistor; and
    an overheat protection circuit configured to restrict output current of the constant voltage circuit in accordance with temperature of the semiconductor device,
    the overheat protection circuit including:
    a diode to detect the temperature of the semiconductor device;
    a resistor provided between the diode and ground;
    a constant current source supplying current to the diode and the resistor;
    a reference voltage line; and
    a comparator for comparing a potential at an anode of the diode to a potential on the reference voltage line, wherein the comparator outputs a signal at a low level when the potential at the anode is greater than the potential at the reference voltage line to control the output transistor to stay on, and the comparator outputs a signal at a high level when the potential at the anode is less than the potential on the reference voltage line to control the output transistor to turn off, and wherein the resistor is formed on the semiconductor device between an N+ region that is a cathode electrode of the diode and a P+ region that is connected to ground.

5. The semiconductor device according to claim 4, wherein the diode is positioned close to the output transistor.

6. The semiconductor device of claim 4, wherein the comparator outputs a signal at a high level shutting off an output current when the potential at the anode of the diode is less than the reference voltage.

* * * * *